United States Patent [19]

Kirschner

[11] 4,072,980
[45] Feb. 7, 1978

[54] THYRISTOR

[75] Inventor: Fritz Kirschner, Lohhof, Germany

[73] Assignee: Siemens Aktiengesellschaft, Berlin & Munich, Germany

[21] Appl. No.: 683,206

[22] Filed: May 4, 1976

[30] Foreign Application Priority Data

May 6, 1975 Germany .............................. 2520134

[51] Int. Cl.² ............................................ H01L 29/74
[52] U.S. Cl. ....................................... 357/38; 357/20; 357/86
[58] Field of Search ........................ 357/20, 38, 39, 86

[56] References Cited

U.S. PATENT DOCUMENTS

| 3,476,992 | 11/1969 | Chu | 357/38 |
| 3,599,061 | 8/1971 | Kokosa | 357/86 |
| 3,725,753 | 4/1973 | Garrett | 357/38 |

FOREIGN PATENT DOCUMENTS

| 2,316,354 | 10/1973 | Germany | 357/38 |
| 2,458,431 | 6/1975 | Germany | 357/38 |

Primary Examiner—Stanley D. Miller, Jr.
Assistant Examiner—Joseph E. Clawson, Jr.
Attorney, Agent, or Firm—Hill, Gross, Simpson, Van Santen, Steadman, Chiara & Simpson

[57] ABSTRACT

A thyristor comprising a semiconductor element is described which has at least four zones of alternate conductivity type with a shunt between an outer zone which serves as an emitter and an adjacent inner zone which serves as a base. A strip shape control electrode is arranged along one edge of the adjacent zone, and an emitter electrode is arranged in contact with substantially all of the outer surface of the emitter. The emitter electrode is provided with a large number of openings arranged in a regular pattern, through which openings portions of the adjacent zone extend into contact with the emitter electrode. The emitter openings are located at the intersection points between first lines running parallel to one another on the one hand, and at second lines which are repeated in a regular sequence parallel to one another and inclined toward the emitter electrode at an angle $\theta$ which is less than 90° and greater than 45°.

5 Claims, 5 Drawing Figures

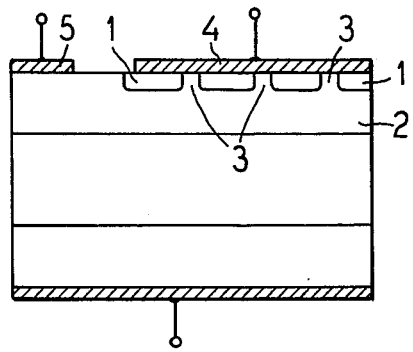
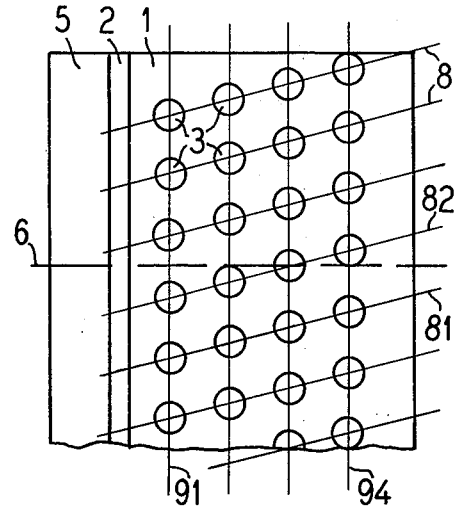
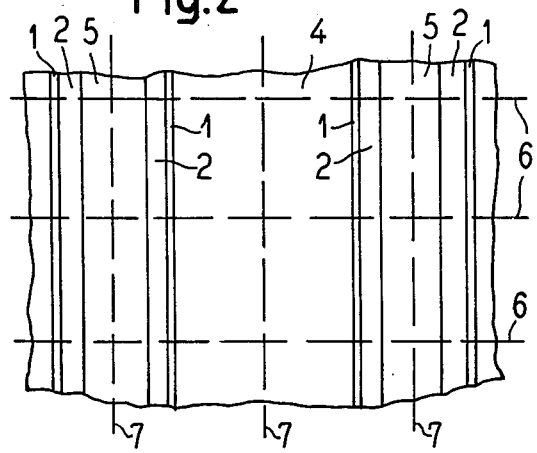
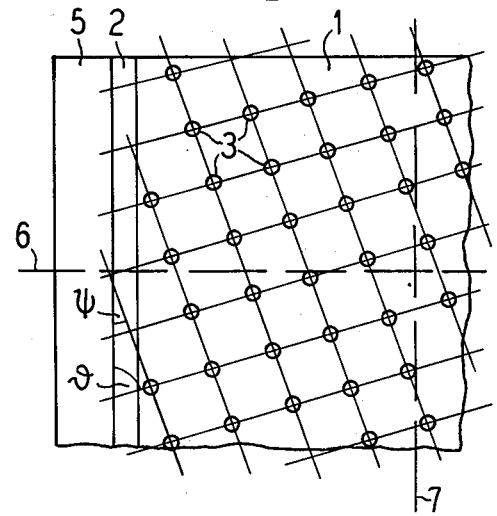
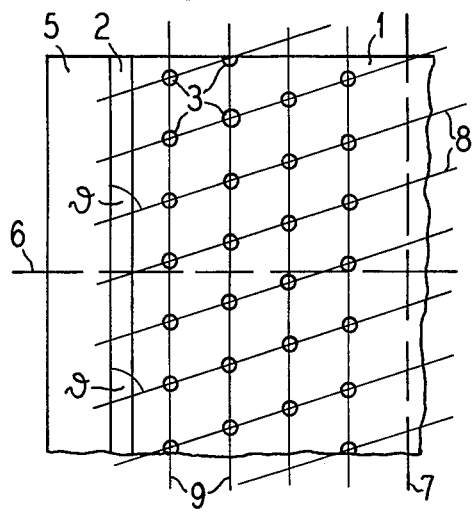

THYRISTOR

BACKGROUND OF THE INVENTION

The field of the present invention is semiconductor thyristors in which portions of the emitter are shunted by portions of the base region extending through the emitter into contact with the emitter electrode.

The shunt of a known thyristor of the aforementioned type is formed by the emitter electrode itself, which on its side facing away from the control electrode extends over the emitter, and is connected to the base. A shunt of this kind has proved advantageous from the electric viewpoint in the case of small-area thyristors having an effective emitter area of, e.g., less than 10 mm². The strip-shaped control electrode, in association with the aforementioned shunt is also highly suitable for the economical production of the aforementioned small-area thyristors. In a known process of this type, to this end a large-area semiconductor element is provided with a number of parallel, metallized strips for the control electrodes and with a number of wider, parallel strips for the emitter electrodes. Here, the metal strips provided for the emitter electrodes are arranged on the emitter of the large-area semidconductor element, and the metal strips provided for the control electrodes are arranged on portions of the base of this semiconductor element, which appear in the form of strips at the surface of the semiconductor element. The large-area semiconductor element is divided up into small-area semiconductor elements by a number of parallel cuts which divide up the base and emitter electrodes in the longitudinal direction, and by a number of cuts running at right angles to the former.

When the described process is also used for larger thyristors, the use of a strip-shaped shunt is limited at effective emitter areas of over 10 to 15 mm², if utilizable $du/dt$ values are to be obtained. The widening of the shunt provides only a limited remedy, as a large part of the emitter surface with an increasing area of the thyristor, comes to lie too far from the shunt for the latter to still exert any effect. In the case of thyristors having a larger emitter area, therefore, one employs cylindrical openings which are arranged in the emitter surface and through which the base extends to the emitter electrode and is electrically connected to the latter. For the simple production of the thyristors, generally a regular arrangement of the shunts is selected. In the case of radial-symmetrical thyristors the shunts can be arranged regularly on concentric circles or otherwise. In the case of thyristors whose semiconductor elements are produced by cutting up a large-area semiconductor element, an arrangement consisting of columns and rows will be selected.

However, during the division of the large-area semiconductor element, it can occur that as a result of inaccurate cutting, entire columns or rows of shunts will be lost. The outcome will be all the more drastic, the more area space occupied by the individual shunt.

SUMMARY OF THE INVENTION

It is an object of the present invention to provide a novel semiconductor thyristor which is constructed in such a manner that it is not necessary to adhere to narrow tolerances in the cutting up of the large area semiconductor element without this giving rise to a noticeable change in the $du/dt$ behavior. The shunt is formed in the present invention by openings which are arranged in the emitter and through which the base is connected to the emitter electrode, these shunts being located at the intersection points of lines running parallel to one another on the one hand, and further lines which recur in a regular sequence parallel to one another, and which further lines are inclined toward the control electrode by an angle of less than 90° and more than 45°. Preferably, the angle is arranged to lie between 60° and 80°. As a general rule, the angle can increase in accordance with a reducing area of the shunt and a decreasing distance between them.

In the case of cylindrical openings with a diameter of approximately 100 μm, and a distance between the two sets of parallel lines of approximately 400 μm, the angle can amount to 75°. As a general rule, in the case of cylindrical openings, the distance between and the diameter of the openings, and the angle are selected to be such that consecutive openings on one and the same further line, and the opening on this further line which is the last considered from the control electrode, and the first opening on the following further line are each displaced from one another by the radius of an opening. Advantageously, the lines which are parallel to one another form an angle which is greater than 0° and less than 45° with the control electrode.

The invention will be explained in detail, making reference to a few exemplary embodiments in association with FIGS. 1 to 4.

BRIEF DESCRIPTION OF THE DRAWINGS

FIG. 1 is a diagrammatic sectional view through a thyristor with openings arranged in the emitter in accordance with the present invention;

FIG. 2 is a diagrammatic plan view of a portion of a large area semiconductor element;

FIG. 3 is a diagrammatic plan view of the emitter of FIG. 1;

FIG. 4 is a diagrammatic plan view of a second embodiment of the present invention; and FIG. 5 is a diagrammatic plan view of the emitter in accordance with a third embodiment of the present invention.

DESCRIPTION OF THE PREFERRED EMBODIMENTS

The thyristor, diagrammatically shown in FIG. 1, includes an emitter 1, the under surface of which is adjoined by a base 2. The emitter 1 possesses openings 3 through which the base 2 extends to an emitter electrode 4. In this way a shunt is formed between emitter 1 and base 2, which in a known manner results in an improvement of the $du/dt$ behavior. The base 2 extends to the surface of the semiconductor element where it is provided with a control electrode 5.

In FIG. 2 corresponding parts to those in FIG. 1 have been provided with like references. It will be seen that the control electrodes 5 and the emitter electrodes 4 are arranged in strip form and in a regular sequence on the large-area semiconductor element. These strips can be produced, for example, by masking and vapor deposition of aluminum or by masking and nickel-plating and/or gold plating. The emitter and that part of the base 2 which appears at the surface of the large-area semiconductor element is likewise in the form of a regularly repetitive sequence of strips. The emitter 1 can be produced in a known manner, e.g., by masking and the diffusion-in of phsophorus. Here the mask in known manner, is arranged so that no phosphorus is diffused into those points at which the openings 3 are to be located. The openings have not been depicted in FIG. 2 for the sake of clarity.

Following the diffusion and the application of the electrodes, the large-area semiconductor element shown in FIG. 2 is divided up into small-area thyristor tablets by a number of parallel cuts 6 and a number of cuts 7 running at right angles to the former. Here the cuts 7 are expediently positioned in such manner that the strip-shaped control electrodes and the emitter electrodes are halved in length.

FIG. 3 illustrates the arrangement of the openings. Parts corresponding to FIGS. 1 and 2 have here again been provided with like references. Here the emitter electrode has been omitted for the sake of clarity. It will be seen that the openings 3 are arranged on lines 9, running parallel to one another, in parallel to the control electrode 5. The openings 3 are located at intersection points of these lines 9 and on parallel further lines which lead away from the control electrode 5 and repeat themselves in a regular sequence. The further lines 8 are inclined by an angle $\theta$ in relation to the control electrode. The angle can amount to between 60° and 80°, the higher value being favorable for smaller diameters of the cylindrical openings 3 and smaller distances between these openings, whereas the angle must reduce in accordance with increasing distance and increasing diameter. When the openings 3 are spaced from one another by, e.g., 400 μm, and possess a diameter of 100 μm, an angle $\theta$ of approximately 75° has proved expedient.

It will be seen that the position of the cut 6 is non-critical, as in the event of a deviation in the cut in the direction of the control electrode 5, never a whole row, but merely individual openings will be lost.

Optimum conditions and a constantly uniform, short-circuited surface are obtained if the openings are arranged as shown in FIG. 4. Parts corresponding to FIGS. 1 to 3 have here again been provided with like references. Here the arrangement of the cylindrical openings 3 is such that openings arranged on one and the same further line, e.g., 81, are each displaced from one another by the amount of a radius of an opening. The last opening on a further line, e.g., 81, and the first opening on the following further line 82 are again displaced from one another by the amount of a radius of the openings. With this kind of distribution of the openings, a short-circuited surface proportional to the emitter surface can always be achieved independently of the position of the cut 6. It is, thus, possible to achieve uniform properties.

An arrangement in which the cuts 7 running parallel to the control electrode 5 are also non-critical is shown in FIG. 5, in which the parallel lines 9 form an angle $\Psi$ which can be greater than 0°, and less than 45°, e.g., 15° with the control electrode 5. the parallel lines 9 and the further lines 8 can, for simplicity, run at right angles to one another, although this is not necessary for the function.

It will be apparent to those skilled in the art that many modifications and variations may be effected without departing from the spirit and scope of the novel concepts of the present invention.

I claim as my invention:

1. A rectangular semiconductor thyristor element having at least four zones of alternate conductivity type with an outer zone forming an emitter and with an adjacent inner zone forming a base, said emitter zone extending over a substantial portion of said base zone and spaced from one marginal edge of said base zone, an emitter electrode in contact with said emitter zone and covering a substantial portion thereof, a strip control electrode on said base adjacent said one marginal edge thereof, said emitter having a large number of openings therethrough through which portions of said base extend into contact with said emitter electrode thereby providing shunts for disruptive discharges during operation, said shunts being located in a series of equally spaced first lines which form an angle with said control electrode of from 0° to 45°, said shunts also being along a series of equally spaced parallel second lines which make a second angle smaller than 90° and larger than 45° with respect to said strip shaped control electrode, each of said shunts lying in both a first line and in a second line, said arrangement of said first and second lines forming a grid-like pattern.

2. A rectangular semiconductor thyristor element according to claim 1, in which said grid-like pattern is in the form of regularly spaced parallelograms.

3. A rectangular semiconductor thyristor element according to claim 1, in which said second angle is between 60° and 80°.

4. A rectangular semiconductor thyristor element according to claim 1, in which said openings are cylindrical and possess a diameter of approximately 100 μm, and in which said first lines are parallel to each other, and in which said first lines are spaced from each other by approximately 400 μm, and further in which the angle of said second lines with said control electrode amounts to approximately 75°.

5. A rectangular semiconductor thyristor element according to claim 1, in which said openings are cylindrical and in which the distance between and the diameter of said openings and the angles which said lines make with said control electrode are such that successive openings on one and the same line are staggered with respect to the openings on the next adjacent line by the radius of an opening.

* * * * *